United States Patent [19]

Feaver et al.

[11] Patent Number: 5,225,376
[45] Date of Patent: Jul. 6, 1993

[54] POLYSILICON TAPER PROCESS USING SPIN-ON GLASS

[75] Inventors: Lloyd W. Feaver, Orangevale, Calif.; Masanori Sakata, Tokyo, Japan

[73] Assignee: NEC Electronics, Inc., Mountain View, Calif.

[21] Appl. No.: 823,038

[22] Filed: Jan. 13, 1992

Related U.S. Application Data

[63] Continuation of Ser. No. 517,874, May 2, 1990, abandoned.

[51] Int. Cl.⁵ .......................................... H01L 21/308
[52] U.S. Cl. .................................... 437/228; 437/229; 437/947; 437/981; 148/DIG. 161; 156/644
[58] Field of Search ............... 437/229, 947, 981, 228; 148/DIG. 161; 156/644

[56] References Cited

U.S. PATENT DOCUMENTS

| | | | |
|---|---|---|---|
| 4,349,408 | 9/1982 | Tarng et al. | 437/233 |
| 4,372,034 | 2/1983 | Bohr | 437/947 |
| 4,372,803 | 2/1983 | Gigante, Jr. | 156/644 |
| 4,393,572 | 7/1983 | Policastro et al. | 437/978 |
| 4,426,687 | 1/1984 | Masuoka | 365/182 |
| 4,484,979 | 11/1984 | Stocker | 437/978 |
| 4,495,220 | 1/1985 | Wolf et al. | 437/229 |
| 4,523,976 | 6/1 | Bukhman | 437/229 |
| 4,536,947 | 8/1985 | Bohr et al. | 29/576 |
| 4,542,340 | 9/1985 | Chakravarti et al. | 324/158 |
| 4,726,879 | 2/1988 | Bondur et al. | 437/233 |
| 4,792,841 | 12/1988 | Nagasawa et al. | 357/59 |
| 4,814,041 | 3/1989 | Auda | 437/981 |
| 4,863,562 | 9/1989 | Bryant et al. | 156/649 |
| 5,041,397 | 8/1991 | Kim et al. | 148/DIG. 161 |
| 5,127,990 | 7/1992 | Pribat et al. | 156/644 |

FOREIGN PATENT DOCUMENTS

| | | | |
|---|---|---|---|
| 83794 | 12/1971 | Fed. Rep. of Germany. | |
| 44-031932 | 12/1969 | Japan. | |
| 57-77785 | 12/1982 | Japan. | |
| 59-141232 | 8/1984 | Japan. | |
| 61-166031 | 7/1986 | Japan | 437/981 |
| 61-180458 | 8/1986 | Japan | 437/231 |
| 61-256743 | 11/1986 | Japan | 437/231 |
| 63-24660 | 2/1988 | Japan. | |
| 63-126248 | 5/1988 | Japan | 437/981 |
| 63-181433 | 7/1988 | Japan | 437/947 |
| 63-202939 | 8/1988 | Japan | 437/947 |
| 2-45930 | 2/1990 | Japan | 437/947 |

OTHER PUBLICATIONS

"Multi-Step Etching of Dissimilar Materials Achieving Selectivity and Slope Control"; IBM Tech. Disc. Bull. vol. 28, No. 7 Dec. 1985 pp. 3136–3137.
Wolf et al., Silicon Processing for the VLSI Era, Lattice Press, Sunset Beach, Calif. (1986) pp. 521–523, 531–532.

Primary Examiner—Brian E. Hearn
Assistant Examiner—Laura M. Holzman
Attorney, Agent, or Firm—Skjerven, Morrill, MacPherson, Franklin & Friel

[57] ABSTRACT

According to the principles of this invention, a polysilicon layer in a semiconductor device is shaped so that in subsequent processing steps a uniform topology is achieved. In particular, a first layer, typically polysilicon, is overlain by a second layer, typically spin-on glass, which is in turn overlain by a mask layer. An opening is formed in the mask layer and the second layer. An isotropic etchant is applied to the structure after the opening is formed. The etchant is formulated to have a differential etch rate in the first and the second layers so that the first layer after etching has an edge surface with a taper of less than 60° and preferably about 45°.

18 Claims, 7 Drawing Sheets

POLYSILICON TAPER PROCESS USING SPIN-ON GLASS

This application is a continuation of application Ser. No. 07/517,874, filed May 2, 1990, now abandoned.

BACKGROUND OF THE INVENTION

1. Field of the Invention

This invention relates generally to a method for forming polysilicon structures in semiconductor devices and more specifically to an improved process for forming tapered polysilicon structures.

2. Description of the Prior Art

Typically, high-capacity dynamic random access memory (DRAM) cell structures are fabricated on a semiconductor chip having many thousands of similar cells and successful operation of the chip requires that all such cells be free of defects. However, the standard process for forming DRAM cells in an array frequently results in an unwanted structure that shorts the transfer gates in two adjacent memory cell structures.

This problem is best understood by considering the fabrication steps used to form prior art DRAM cells on a semiconductor chip. Only the processing steps related to the failure mechanism are described herein. The other processing steps are known to those skilled in the art. As shown in FIG. 1, the substrate is typically overlain by a thin dielectric region 12. For example, dielectric region 12 may consist of a thin silicon oxide layer 12A, typically about 50 Å thick, which is formed on substrate 10, and in turn covered by a silicon nitride layer 12B, typically about 100 Å thick. After formation of silicon nitride layer 12B, polysilicon layer 14 is formed which in turn is overlain by a sacrificial oxide layer 15.

After formation of oxide layer 15, a photoresist mask 17 (FIG. 2) is formed on oxide layer 15 with opening 17-3 that is used to define the extent of the capacitance electrode in the DRAM cell. As oxide layer 15 (FIG. 2) is etched, photoresist mask 17 is undercut as shown in FIG. 3. Photoresist mask 17 is subsequently stripped using a wet etch process leaving the structure illustrated in FIG. 4.

Etched oxide layer 15 is used as a mask for a wet etch of capacitance polysilicon layer 14 to form the structure shown in FIG. 5. Sacrificial oxygen layer 15 is then removed to leave the structure of FIG. 6.

The shape of edge surface 14C of capacitance plate 14 was formed by the wet etch of capacitance polysilicon layer 14 and angle $\gamma$ between bottom surface 14A of electrode 14 and edge surface 14C is determined by the etching process. Angle $\gamma$ is typically in the range of about 90° to about 60° with a typical angle being about 80°.

The steep inclination of edge surface 14C is one factor that limits the yield of prior art DRAM cells. Oxide layer 16 is subsequently formed on polysilicon layer 14. Oxide layer 16 typically forms a protruding lip 16A as shown in FIG. 7. Lip 16A is the structure which directly contributes to creation of one failure mechanism for a DRAM cell. Lip 16A extends around the perimeter of elliptical opening 28 (FIG. 7).

After formation of oxide layer 16, a triple-etch, using oxide layer 16 as a mask, is used to remove dielectric layers 12A, 12B between oxide layer 16-1, 16-2 so that surface $10_1$ of substrate 10 is exposed. Gate oxide 20 is grown on surface $10_1$, and then the entire structure is overlain by a polysilicon layer 18A (FIG. 8). A mask and a plasma etch are typically used to form gates 18-1, 18-2 (FIG. 9) from polysilicon layer 18A. However, the plasma etch fails to remove polysilicon 18B under lip 16A because the plasma etch is shielded from this area by lip 16A.

Accordingly, gate structures 18-1, 18-2 are connected by polysilicon 18B (FIG. 10) and the associated DRAM cells are electrically shorted through gate 18.

Hence, the steep inclination of edge surface 14C of capacitance polysilicon results in protruding lip 16A being formed in overlying oxide layer 16 which in turn results in a failure mechanism for the associated DRAM cell. This failure mechanism is a function of the prior art processing steps so that to obtain increased yield, two additional processing steps are required. Removal of polysilicon 18B requires another mask step and an isotropic etch so as to break polysilicon 18B in two places. These additional processing steps while increasing yields also increase processing costs and processing times.

SUMMARY OF THE INVENTION

The novel process of this invention eliminates the unwanted structures formed in the prior art processing of a DRAM cell structure, for example. In particular, a selected layer overlying a semiconductor substrate is formed with a tapered end surface so that in subsequent processing steps no unwanted structures are formed.

According to the principles of this invention, a first layer of a first material is formed over a support to a predetermined thickness. The first layer has a first surface that is substantially parallel to the surface of the support and a second surface which is substantially parallel to the first surface and separated from the first surface by the predetermined thickness.

Subsequent to the formation of the first layer, a second layer of a second material is disposed on the first layer and formed to a predetermined thickness. Subsequently a mask layer is disposed on the second layer. An important aspect of this invention is that the mask layer must be selected such that in subsequent processing steps the mask layer does not lift off the second layer. After the formation of the mask layer, an opening is formed in the mask layer and the second layer.

After preparation of the mask, an etchant, which has a first predetermined etch rate for the first material and a second predetermined etch rate for the second material, is used to remove the first layer down to the surface of the support. The materials of the first and second layers and the thickness of the first and second layers are selected so that the first layer after etching has an end surface with a taper of less than 60° and preferably about 45°. As used herein, "taper" means the angle formed by the intersection of the end surface and the first surface.

The smooth taper of the first layer results in smoothly contoured surfaces in subsequent processing steps such that anisotropic and isotropic etches remove all the desired material in each processing step. Accordingly, the taper achieved using the process of this invention increases yields and productivity. Moreover, since the relative size of the structure with respect to the support surface is unchanged, the tapered structure operates in the same manner as prior art structures with abrupt geometric changes.

DETAILED DESCRIPTION

Prior art processing to form DRAM cells, as described above, resulted in a polysilicon structure with abrupt geometric features that resulted in the formation of unwanted structures during subsequent processing steps. Elimination of the unwanted structures required additional processing steps. According to the principles of this invention, a process is provided for forming polysilicon structures wherein unwanted structural features, unlike the prior art process, are not formed by subsequent processing steps, and the number of processing steps is not increased. In fact, the total number of processing steps is reduced Hence, yield is increased by the elimination of the unwanted structural features and cost is reduced by elimination of processing steps.

In particular, according to the principles of this invention, a first layer 112 (FIG. 11A), typically polysilicon, is overlain by a second layer 114, typically spin-on glass, which in turn is overlain by a mask layer 116. An opening 120 is formed in mask layer 116 and second layer 114.

Figure 11A:
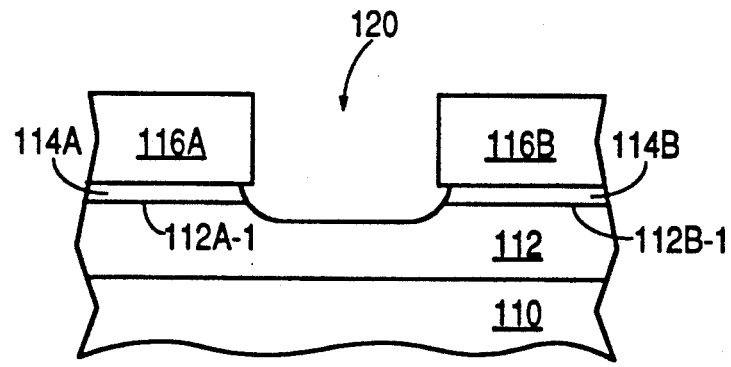
FIGS. 11A through 11C illustrate a time sequence in the formation of a structure with a tapered end surface according to the principles of this invention.

An isotropic etchant is applied to the structure after opening 120 is formed to shape the polysilicon layer 112 such that in subsequent processing steps a uniform topology is achieved Specifically, when the isotropic etchant is applied to the structure, second layer 114 limits the exposure of underlying layer 112 to the etchant. For example, as illustrated in FIG. 11A, at time t only a portion of first layer 112 has been removed and a portion of second layer 114A, 114B, but the portion of upper surface 112A-1, 112B-1 of layer 112 under mask layer 116A, 116B has not yet been exposed to the etchant.

Figure 11B:
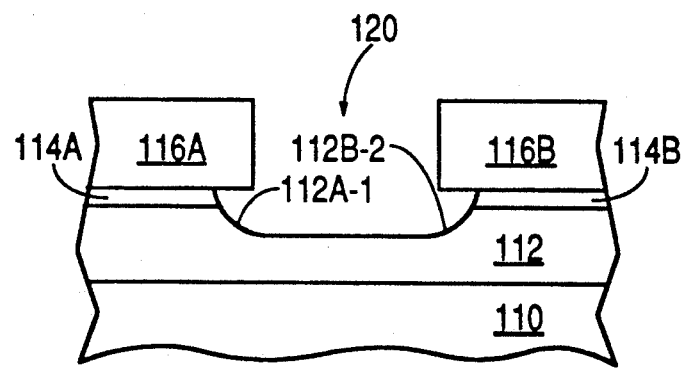
Figure 11C:
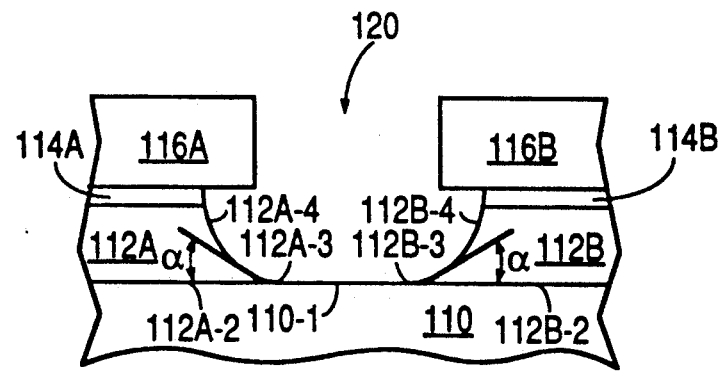

At time $t + \Delta t_1$, as illustrated in FIG. 11B, layer 114A, 114B has been etched so that both upper surface 112A-1, 112B-1 of layer 112 under mask layer 116A, 116B and a portion of layer 112 under hole 120 has been removed. The etchant, as described below, has been formulated to have a first etch rate in layer 112 and a second etch rate in layer 114, i.e., a differential etch rate. As the wet etch continues, at a later time $t + \Delta t_2$ (FIG. 11C), first layer 114A, 114B is removed further under mask layer 116A, 116B. Thus, additional surface area of layer 112A, 112B has been exposed to the etchant and layer 112A, 112B has been removed under hole 120 down to surface 110-1 of layer 110.

Further, lower surface 112A-2 of layer 112A now has an edge 112A-3. End surface 112A-4 of layer 112 intersects lower surface 112A-2 at edge 112A-3. The etch rate is such that an angle α formed by the intersection of end surface 112A-4 with lower surface 112A-2 defines the taper of layer 112A. According to the principles of this invention the taper is less than about 60° and greater than about 30°. Preferably, the taper is about 45°.

As described more completely below, the material of first layer 112, the material of second layer 114, the relative thickness of first layer 112, second layer 114, and mask layer 116 are selected to achieve a desired taper of first layer 112 upon etching. (Herein, thickness refers to the dimension of the layer in the direction that is substantially perpendicular to the support for the layers.) Moreover, the etchant is formulated for use in combination with the materials to achieve the desired taper.

Figure 12:
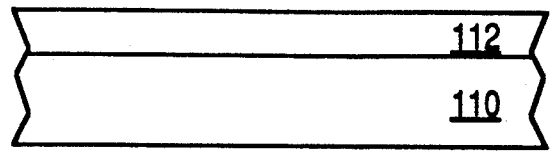
FIG. 12 illustrates the initial structure used in the formation of the tapered polysilicon layer according to the principles of this invention.

In one embodiment of this invention, a polysilicon layer 112 is deposited by chemical vapor deposition on a support 110 (FIG. 12). Typically, layer 112 has a thickness in the range of about 2,000 Å to about 6,000 Å, and in one embodiment about 3,600 Å. The underlying material on which polysilicon layer 112 is deposited is not critical and in fact, support 110 could be a passivation material, a dielectric material as in the prior art DRAM cell, or a semiconductor substrate, for example.

Figure 13:
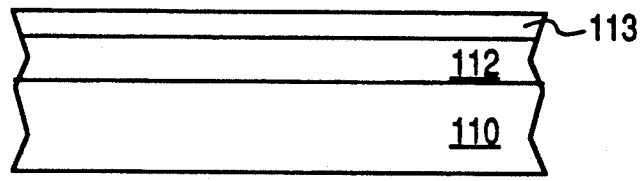
FIG. 13 illustrates the structure of FIG. 12 after a phosphosilicate glass layer has been added to the structure according to the principles of this invention.

Subsequent to the formation of polysilicon layer 112, a phosphorus silicate glass 113 (FIG. 13) is grown to a thickness of about 800 Å, in one embodiment, on polysilicon layer 112 Phosphorus silicate glass layer 113 is formed using chemical vapor deposition in an oxygen atmosphere at ambient pressure. Nitrogen is bubbled through phosphorous oxy-chloride, $POCl_3$, for a period of time sufficient to grow 800 Å layer 113. Layer 113 is grown such that underlying polysilicon layer 112 is doped to about 20 ohms per square.

Figure 14:
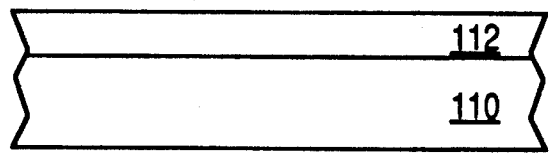
FIG. 14 illustrates the structure of this invention after doping of the polysilicon layer and removal of the phosphosilicate glass layer.
Figure 15:
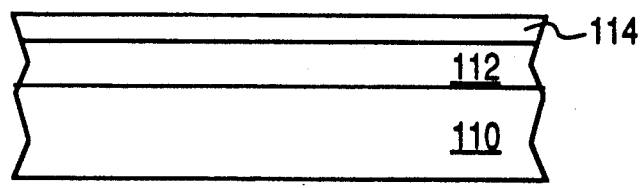
FIG. 15 illustrates the structure of FIG. 14 after spin-on glass is disposed on the polysilicon layer according to the principles of this invention.
Figure 16:
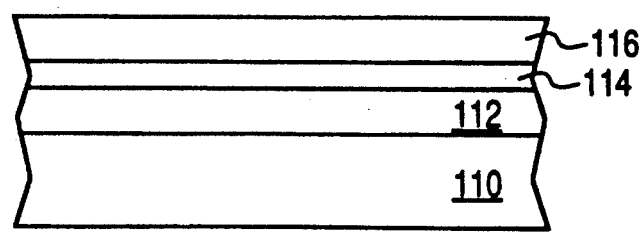
FIG. 16 illustrates the structure of FIG. 15 after a phosphosilicate glass layer is disposed on the spin-on glass layer according to the principles of this invention.

After doping of polysilicon layer 112, phosphorus silicate glass 113 is removed using a standard wet etch (FIG. 14). Subsequently, a silicon dioxide layer 114 is formed on polysilicon layer 112 (FIG. 15). Silicon dioxide layer 114 is formed, in one embodiment, by spinning the wafer, as described below, and spraying a silica-isopropyl alcohol mixture, such as that available from Allied Chemical of Pittsburg, Calif. under Part No. P-112, onto the wafer In this embodiment, the nozzle size for the spray was one millimeter in diameter and a flow rate was maintained by a feed pressure of about 0.7 $Kg/cm^2$ to the nozzle. The nozzle tip was located about 15 mm vertically above the wafer. In one embodiment, a silica spin coater available from Tokyo Ohka Kogyo of Tatsumo, Japan, under Model No. TR6200D was used.

In this embodiment, the wafer was rotated at 100 revolutions per minute (rpm) and the silica-isopropyl alcohol mixture was dispensed through the nozzle for one second. The wafer was then spun at 300 revolutions for one second and then at 4,000 rpm for nine seconds. The mixture is dispersed and dried by this spinning.

As the silica-isopropyl alcohol mixture interacts with polysilicon layer 112, a soft oxide layer at ambient temperature is formed. This layer is sometimes referred to as spin-on glass. Typically, spin-on glass layer 114 is in the range of 300 to 2,500 Å thick and in one embodiment was about 1,500 Å thick. Fracture of layer 114 in subsequent processing steps limits the thickness of the layer. After formation of layer 114, the structure in FIG. 15 is dry baked in a diffusion tube with nitrogen annealing at a temperature in the range of about 800° C. to about 1,000° C. and in one embodiment about 900° C. for a period of about 60 minutes Subsequently, layer 114 is overlain with phosphosilicate glass layer 116 with a thickness of from about 2,500 Å to about 10,000 Å and in one embodiment about 7,000 Å. Layer 116 is formed by atmospheric pressure chemical vapor deposition (APCVD) at a temperature of 390° C. to 410° C. with an atmosphere of silane, phosphine and oxygen with the gas atmosphere having about 4 mole percent phosphorus. The range of phosphorus in the gas may vary from about 4 mole percent to about 8 mole percent. The important aspect is to form a mask layer that adheres to spin-on glass layer 114 during subsequent processing. A prior art photoresist mask was not used because subsequent wet chemical processing would lift off the photoresist mask.

Figure 17:
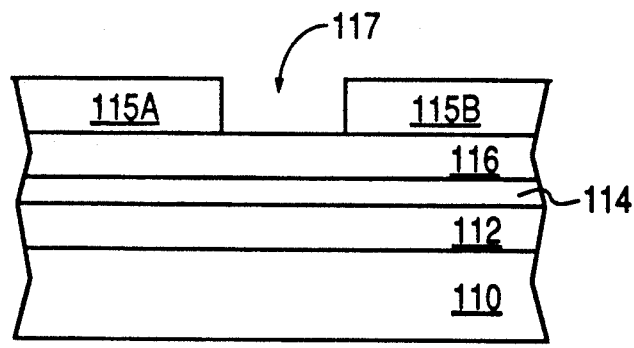
FIG. 17 illustrates the structure of FIG. 16 after a photoresist mask is formed on the phosphosilicate glass layer according to the principles of this invention.
Figure 18:
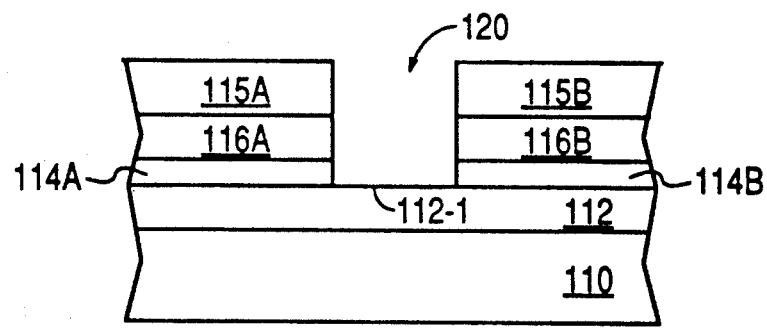
FIG. 18 illustrates the structure of FIG. 17 after anisotropic etching according to the principles of this invention

After formation of phosphosilicate glass layer 116, a photoresist mask layer 115 is formed on the phosphosilicate glass and a hole 117 (FIG. 17) opened in the photoresist using conventional technologies. After mask 115A, 115B is formed, an anisotropic etch is used to remove phosphosilicate glass layer 116 and spin-on glass 114 down to surface 112-1 of polysilicon layer 112 (FIG. 18).

In one embodiment, a "Freon" 23 and $O_2$ atmosphere in an anisotropic dielectric etcher was used to perform this etch. The plasma gas mixture is "Freon" 23 and from 3% to 30% oxygen. The process temperature ranges from zero to 80° C. and the pressure ranges from 20 to 80 millitorr. One anisotropic dielectric etcher suitable for use in the process of this invention is supplied by Applied Materials of Sunnyvale, Calif. under Model No. 8110.

Figure 19:
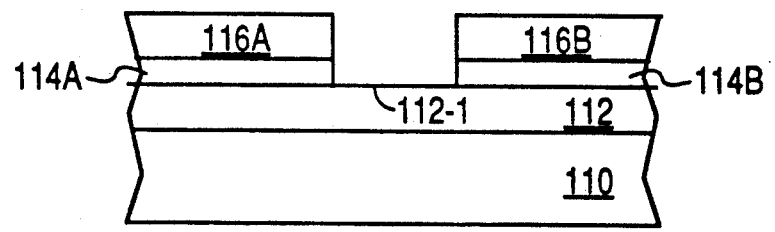
FIG. 19 illustrates the structure of FIG. 18 after removal of the photoresist mask according to the principles of this invention.
Figure 20:
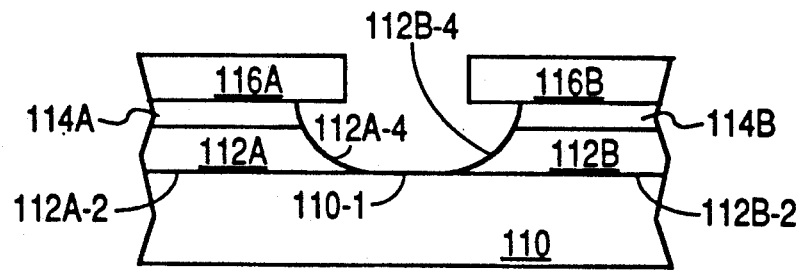
FIG. 20 illustrates the structure of FIG. 19 after the isotropic wet etch according to the principles of this invention.
Figure 21:
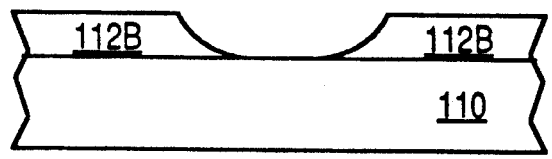
FIG. 21 illustrates the structure of this invention after the removal of the mask layer for the wet etch.
Figure 22:
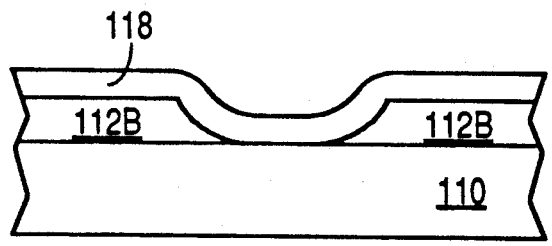
FIG. 22 illustrates the uniform topology of the structure of this invention.

Subsequent to the plasma etching of the phosphosilicate glass 116 and spin-on glass 114, photoresist 115 is removed to produce the structure illustrated in FIG. 19. A wet etch is then used to taper polysilicon layer 112. Specifically, in one embodiment, spin-on glass layer 114A, 114B is etched at a rate twice the etch rate for polysilicon layer 112. The wet etch produces the structure in FIG. 20. The phosphosilicate glass 116A, 116B and the residual spin-on glass 114A, 114B are removed using standard processes known to those skilled in the art (FIG. 21). Subsequently, an oxide layer 118 (FIG. 22) is formed over polysilicon layer 112A, 112B, which has a smooth topology without any hidden areas.

Figure 1:
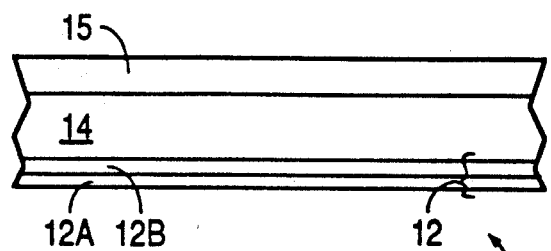
FIG. 1 illustrates a prior art structure used in formation of a prior art DRAM memory cell.
Figure 2:
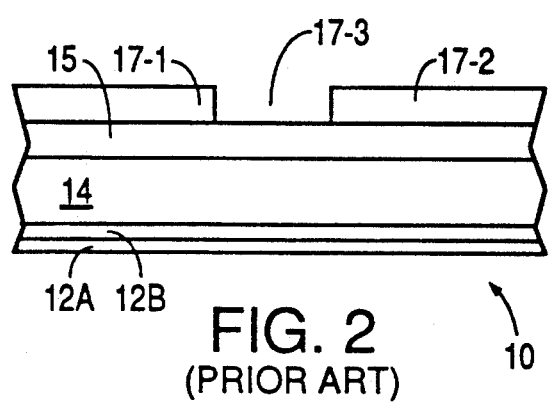
FIG. 2 illustrates a photoresist layer used in formation of the prior art DRAM memory cell.
Figure 3:
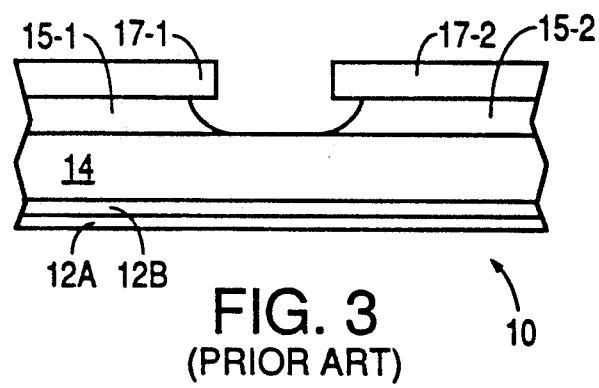
FIG. 3 illustrates the structure of FIG. 2 after etching the oxide layer.
Figure 4:
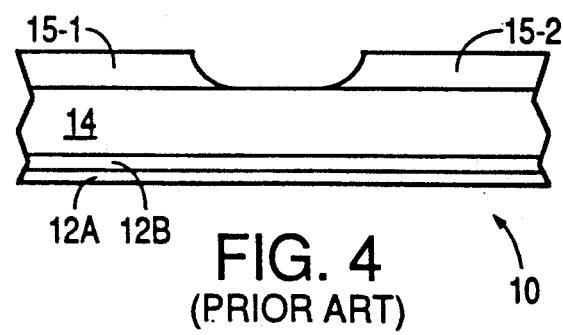
FIG. 4 illustrates the structure of FIG. 3 after removal of the photoresist layer.
Figure 5:
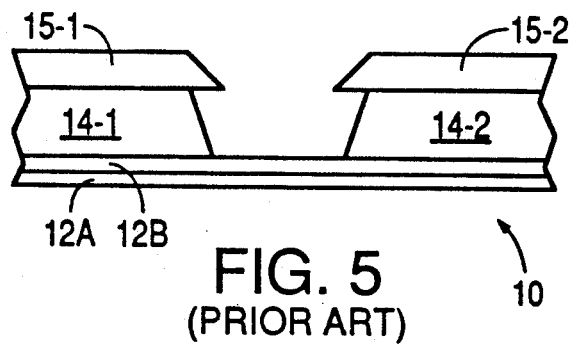
FIG. 5 illustrates the structure of FIG. 4 after etching the polysilicon layer.
Figure 6:
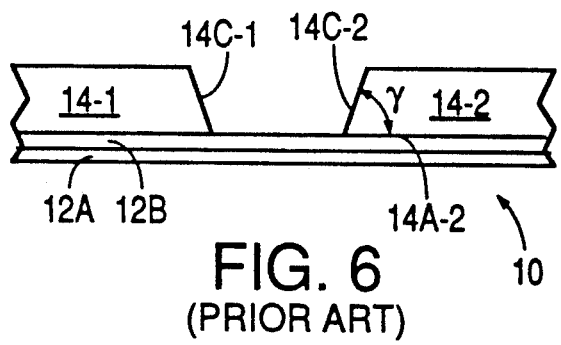
FIG. 6 illustrates the structure of FIG. 5 after removing the sacrificial silicon dioxide layer.
Figure 7:
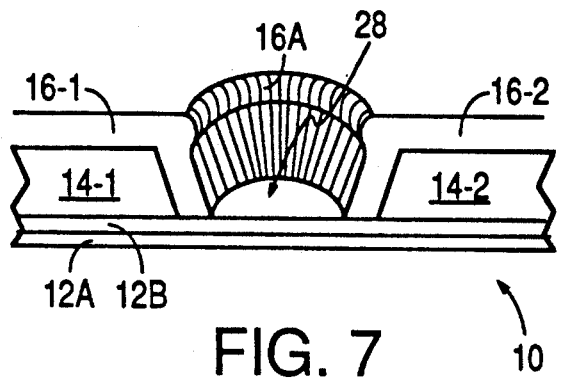
FIG. 7 is a prospective view of the structure in FIG. 6 after an oxide layer is grown over the polysilicon layer.
Figure 8:
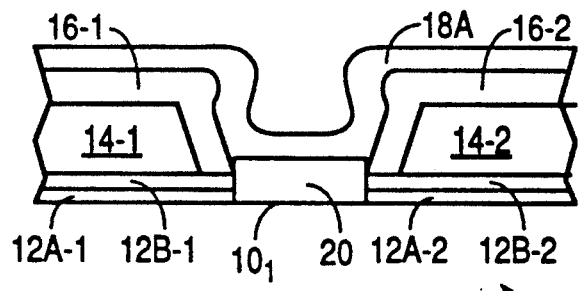
FIG. 8 illustrates the structure of FIG. 7 after a polysilicon layer is formed over the structure.
Figure 9:
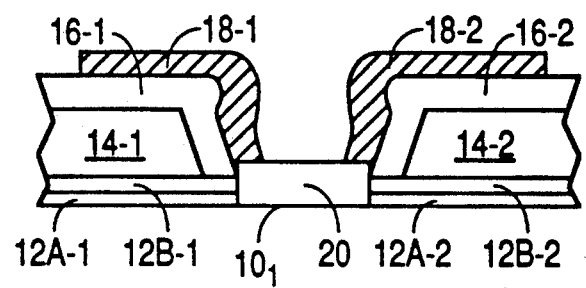
FIG. 9 illustrates the transfer gates which are formed from the structure of FIG. 8.
Figure 10:
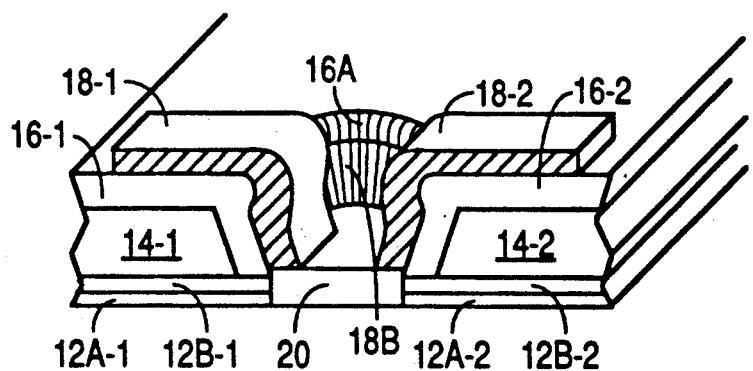
FIG. 10 is a prospective view of the structure in FIG. 9 illustrating the polysilicon connecting the transfer gates.

Smooth oxide layer 118 is in sharp contrast to layer 16 (FIG. 7) that was formed by the prior art processes. In addition to the smooth topology that eliminates formation of unwanted structures, the fundamental characteristics of the tapered polysilicon structure with respect to the semiconductor device containing the structure have not changed Specifically, the dimensions of the surface of the tapered structure over the underlying support are the same as in the prior art device. Therefore, the process of the invention increases yield and decreases processing steps without affecting performance of the resulting semiconductor device.

In one embodiment, the taper of layer 112 is controlled not only by the materials used in layers 112, 114 but also by the wet etch chemistry. The etchant is selected in combination with the materials so as to achieve the predetermined taper for polysilicon layer 112. In this embodiment, a buffering and ionizing medium, a mixture of glacial acetic acid and iodine, is first formed. The iodine is added to the glacial acetic acid so the resulting medium has a predetermined percentage by weight of iodine. In one embodiment, the iodine glacial acetic acid mixture has about 2–3% (wt %) iodine.

Next, an etch acid is formed using two acids, e.g., nitric acid and hydrofluoric acid. The two acids are combined in portions sufficient to form an etch acid. For example, a solution of about 49% hydrofluoric acid and a solution of about 63% nitric acid were used to form the etch acid. Specifically, about seven parts by volume of the nitric acid solution were mixed with about one part by volume of the hydrofluoric acid solution.

After formation of the etch acid, the etch acid and the buffering and ionizing medium are combined in proportion sufficient to form an etchant having a first predetermined etch rate for the first material and a second predetermined etch rate for the second material. In this embodiment, one part by volume of the etch acid was mixed with seven parts by volume of the glacial acetic acid/iodine mixture to form the etchant. The resulting etchant was maintained at a temperature of 17° C.±2° C. Adjustment of the etchant temperature may also effect the taper.

During the wet etch, the nitric acid in the etchant forms an autocatalytic system in the oxidation of polysilicon layer 112 and the hydrofluoric acid dissolves the resulting silicon oxide. Hence, the hydrofluoric acid etches both polysilicon layer 112 and spin-on glass layer 114. The glacial acetic acid/iodine mixture acts as a buffering and ionizing medium during the etching. The specific acids are illustrative of the principles of this invention and are not intended to limit the invention to the specific embodiment described. The important aspect is that the etchant has a differential etch rate in the two materials being etched.

When this etchant solution was used to etch spin-on glass 114 and polysilicon layer 112, the etch rate of the spin-on silica glass was approximately twice as great as the etch rate of the polysilicon, so that the resulting taper of polysilicon layer 112 was about 45°. During the etching, gentle up and down agitation (e.g., about a 2 cm. stroke—top to bottom—with about 5 seconds per agitation cycle) was used to aid in etch uniformity.

The embodiments described herein are illustrative only of the principles of the invention and are not intended to limit the scope of the invention. In view of the above disclosure, one skilled in the art will understand that alternative layers could be etched according to the principles of this invention so that prior art failure mechanisms are not formed in subsequent semiconductor processing. Another method for forming a tapered polysilicon layer is disclosed in copending and commonly assigned U.S. patent application Ser. No. 07/518,607, now U.S. Pat. No. 5,068,707 entitled "Taper C-Poly Process" filed on the date of this application by Gary A. Pors and Gernia Tang and incorporated herein by reference in its entirety.

We claim:

1. A method for forming a tapered layer in a semiconductor device comprising the steps of:
   (i) disposing a first material over a support to form a first layer with a predetermined thickness, said first layer having (i) a first surface substantially parallel to a surface of said support, and (ii) a second surface substantially parallel to said first surface and separated from said first surface by said predetermined thickness;
   (ii) disposing a second material on said first layer to form a second layer;
   (iii) disposing a masking layer on said second layer;
   (iv) forming an opening in said masking layer and said second layer to said second surface using a single etch step;
   (v) etching said first and second layers through said opening with a wet etchant having predetermined properties, wherein upon completion of said etching, said first surface has an edge, said second surface has an edge, said first surface edge and said second surface edge being joined by a tapered edge surface wherein the angle formed by the intersection of said tapered edge surface and said first surface at said first surface edge is less than 60°.

2. The method of claim 1 wherein said first layer is polysilicon.

3. The method of claim 2 wherein said predetermined thickness of said polysilicon layer is in the range of about 2,000 Å to about 6,000 Å.

4. The method of claim 3 wherein said predetermined thickness is about 3,600 Å.

5. The method of claim 2 wherein said second layer is spin-on glass.

6. The method of claim 5 wherein said second layer has a thickness in the range of from about 300 Å to about 2,500 Å.

7. The method of claim 6 wherein said thickness of said second layer is about 1,500 Å thick.

8. The method of claim 5 wherein the step of disposing the second layer of a second material on said first layer includes the steps of:
   spinning the support at a predetermined number of revolutions per minute and spraying a silica-alcohol mixture onto said first layer; and
   dry baking said second layer at a predetermined temperature for a predetermined time period.

9. The method of claim 8 wherein said predetermined temperature is in the range of about 800° C. to about 1,000° C.

10. The method of claim 9 wherein said temperature is about 900° C.

11. The method of claim 1 wherein the step of disposing a masking layer on said second layer comprises disposing a phosphosilicate glass layer on said second layer.

12. The method of claim 1 wherein said step of forming an opening in said masking layer and said second layer comprises anisotropic etching of said masking layer and said second layer.

13. The method of claim 1 wherein said predetermined properties of said etchant include an etch rate for said second layer that is about twice the etch rate for said first layer.

14. The method of claim 13 wherein the etchant having predetermined properties is formed by the steps of:
   combining glacial acetic acid and iodine in proportions sufficient to form a mixture having a predetermined weight percent of iodine;
   combining a first acid and a second acid in proportions sufficient to form an etch acid; and
   combining said mixture with said etch acid in proportions sufficient to form said etchant having said predetermined properties.

15. The method of claim 14 wherein the predetermined weight percent of iodine in the range of about 3–4%.

16. The method of claim 14 wherein the first acid is hydrofluoric acid and the second acid is nitric acid.

17. The method of claim 16 wherein one part by volume of hydrofluoric acid is combined with seven parts of volume of nitric acid to form said etch acid.

18. The method of claim 14 wherein about one part by volume of said etch acid is combined with about seven parts by volume of said mixture to form said etchant.

* * * * *